(12) United States Patent
Joret et al.

(10) Patent No.: US 12,425,011 B2
(45) Date of Patent: Sep. 23, 2025

(54) METHOD FOR DETERMINING THE PHASE DIFFERENCE BETWEEN A FIRST CLOCK SIGNAL RECEIVED BY A FIRST ELECTRONIC COMPONENT AND A SECOND CLOCK SIGNAL RECEIVED BY A SECOND ELECTRONIC COMPONENT

(71) Applicant: Teledyne e2v Semiconductors SAS, Saint Egreve (FR)

(72) Inventors: Simon Joret, Saint Egreve (FR); Quentin Beraud-Sudreau, Saint Egreve (FR); Rémi Laube, Saint Egreve (FR); St éphane Breysse, Saint Egreve (FR); Matthieu Martin, Saint Egreve (FR); Julien Cochard, Saint Egreve (FR)

(73) Assignee: Teledyne e2v Semiconductors SAS, Saint Egreve (FR)

( * ) Notice: Subject to any disclaimer, the term of this patent is extended or adjusted under 35 U.S.C. 154(b) by 92 days.

(21) Appl. No.: 18/466,525

(22) Filed: Sep. 13, 2023

(65) Prior Publication Data
US 2024/0120909 A1  Apr. 11, 2024

(30) Foreign Application Priority Data

Sep. 22, 2022 (FR) ...................... 2209612

(51) Int. Cl.
*H03K 5/14* (2014.01)
*H03K 5/05* (2006.01)
(Continued)

(52) U.S. Cl.
CPC ................ *H03K 5/14* (2013.01); *H03K 5/05* (2013.01); *H03K 19/1774* (2013.01); *H03L 7/191* (2013.01); *H03K 2217/9401* (2013.01)

(58) Field of Classification Search
CPC ........ H03K 5/14; H03K 5/05; H03K 19/1774; H03K 2217/9401; H03K 5/1534;
(Continued)

(56) References Cited

U.S. PATENT DOCUMENTS 10,509,104 B1     12/2019  Dato
11,736,099 B1 *    8/2023  Wu ........................... H03K 5/26
                                                          327/77
(Continued)

FOREIGN PATENT DOCUMENTS

WO     2021032767 A1    2/2021

OTHER PUBLICATIONS

Marc Stackler et al., "A novel method to synchronize high-speed data converters," 2016 IEEE Radar Conference (RadarConf), May 2-6, 2016.
(Continued)

*Primary Examiner* — John W Poos
(74) *Attorney, Agent, or Firm* — Pilloff Passino & Cosenza LLP; Rachel K. Pilloff; Sean A. Passino

(57) ABSTRACT

The invention relates to a method for determining the phase difference between a first clock signal (CK1) received by a first electronic component (CE1) and a second clock signal (CK2) received by a second electronic component (CE2), comprising the steps of:
  S10) transmitting a first calibration signal (S12);
  S20) measuring a first delay ($T_1$);
  S30) transmitting a second calibration signal (S21);
  S40) measuring a second delay ($T_2$);
  S50) measuring the number (n) of clock pulses between the transmission of the first calibration signal (S12) and the active edge of the first clock signal (CK1) consecutive to the active edge of the second calibration signal (S21);

(Continued)

S60) determining the phase difference depending on the parity of the number (n) of clock pulses.

20 Claims, 8 Drawing Sheets

(51) Int. Cl.
*H03K 19/17736* (2020.01)
*H03L 7/191* (2006.01)

(58) Field of Classification Search
CPC ........ H03L 7/191; G06F 1/12; H03M 1/0624; H03M 1/12; H03M 1/66; H04L 7/0012
See application file for complete search history.

(56) References Cited

U.S. PATENT DOCUMENTS

| | | | |
|---|---|---|---|
| 2020/0076439 A1* | 3/2020 | Weeks | H03L 7/0805 |
| 2021/0200256 A1* | 7/2021 | Shi | G06F 1/12 |
| 2022/0206987 A1* | 6/2022 | Bal | G06F 1/12 |
| 2022/0302922 A1 | 9/2022 | Béraud-Sudreau et al. | |

OTHER PUBLICATIONS

Search Report for France Application No. 2209612, mailed May 12, 2023.

\* cited by examiner

METHOD FOR DETERMINING THE PHASE DIFFERENCE BETWEEN A FIRST CLOCK SIGNAL RECEIVED BY A FIRST ELECTRONIC COMPONENT AND A SECOND CLOCK SIGNAL RECEIVED BY A SECOND ELECTRONIC COMPONENT

TECHNICAL FIELD

The invention relates to a method for determining the phase difference between a first clock signal received by a first electronic component and a second clock signal received by a second electronic component, and to a system for determining the phase difference between a first clock signal received by a first electronic component and a second clock signal received by a second electronic component.

In an electronic system, clock distribution constraints increase with clock frequency. It is sometimes necessary to check clock alignment between various components of the same type to make them work together, for example a plurality of analogue-to-digital converters in an antenna array or in an AESA radar (AESA standing for Active Electronically Scanned Array). These clock alignments sometimes need to have a precision better than one degree. For example, for a 12 GHz clock, one degree of phase difference corresponds to approximately 200 fs. These required small phase differences are directly impacted by routing, process variations during PCB manufacture, or even components. This makes clock alignment difficult.

In a configuration employing a plurality of electronic components, one or more clock generators transmit a clock signal over various clock paths. Because of the aforementioned dispersions, the phase of the clock signal may differ from one component to another, this potentially compromising the synchronization of the electronic components.

To achieve an alignment of the order of one hundred femto-seconds, the phase difference between each component must be measured, and then corrected either through post-processing, or through delay generation on the clock paths, or through use of solutions embedded in the components.

To measure the phase difference, one known solution consists in calibrating the final system after manufacture. A predetermined signal is injected as input into the various components, and the phase differences between the channels are compared through post-processing.

This solution has the following drawbacks:
  for each system, it is necessary to characterize phase difference over the entire operating range (temperature, supply voltage level, working frequency). This requires complex and expensive testing means.
  it is necessary to check the value of these parameters in real time, in order to apply the correct correction, this resulting in significant additional complexity, especially when the number of channels is high.
  there is a risk of adjustment being lost over time as a result of components ageing. It must therefore be regularly updated.

Some systems incorporate calibration channels with a view to updating the measurement of phase differences in real time. The main advantage of this solution is that the phase of characterization in the factory over the entire operating range is avoided. The phase difference is measured in real time, and the corresponding correction is applied. The correction takes into account ageing of the components.

However, known solutions for measuring phase difference in real time have the following drawbacks:
  specific channels must be provided for the calibration, this increasing the size, consumption, cost and complexity of the system. In addition, switches are required to switch between calibration mode and normal operating mode. These switches may degrade RF performance by generating spurious high-frequency signals.
  calibration mode and normal operating mode are exclusive. There is therefore a loss of service during calibration.
  the measurement of phase difference consists in making correlations between the various channels. These correlations require a lot of computing power, especially when the number of channels is high. Because these computations are performed by the system, the resources used for the calibration are not available for other tasks.

There is therefore a need for a method for determining, in real time, the phase difference of clock signals distributed to electronic components, which does not result in a loss of service during calibration.

Summary of the invention

One subject of the invention is therefore a method for determining the phase difference between a first clock signal received by a first electronic component and a second clock signal received by a second electronic component, the first clock signal and the second clock signal being generated synchronously and having an identical clock period, comprising the steps of:
  S10) transmitting by means of the first electronic component a first calibration signal synchronously with the first clock signal;
  S20) measuring a first delay between an active edge of the first calibration signal and an active edge of the second clock signal consecutive to the active edge of the first calibration signal;
  S30) transmitting by means of the second electronic component a second calibration signal synchronously with the second clock signal;
  S40) measuring a second delay between an active edge of the second calibration signal and an active edge of the first clock signal consecutive to the active edge of the second calibration signal;
  S50) measuring the number of clock pulses between the transmission of the first calibration signal and the active edge of the first clock signal consecutive to the active edge of the second calibration signal, the number of clock pulses corresponding to a multiple of the clock period;
  S60) determining the phase difference depending on the parity of the number of clock pulses.

Advantageously, $$T_\phi = \frac{T_1 - T_2}{2} - \frac{T_c}{2}$$

if n is odd $$T_\phi = \frac{T_1 - T_2}{2}$$

if n is even
where n corresponds to the number of clock pulses, $T_\phi$ corresponds to the phase difference between the first clock signal and the second clock signal, $T_1$ corresponds to the first delay, $T_2$ corresponds to the second delay, and $T_c$ corresponds to the clock period.

Advantageously, the second calibration signal is transmitted after a predetermined number of clock pulses consecutive to the first delay.

Advantageously, the method further comprises a step of correcting the phase difference between the first electronic component and the second electronic component, depending on the phase difference determined in step S60).

Advantageously, the phase difference is determined periodically.

Advantageously, the first calibration signal is routed over a first line, the second calibration signal is routed over a second line, the length of the first line and the length of the second line being equal.

As a variant, the first calibration signal and the second calibration signal are routed over the same bidirectional line, the second calibration signal being delayed with respect to receipt of the first calibration signal so as to avoid a conflict between the first calibration signal and the second calibration signal.

The invention also relates to a system for determining the phase difference between a first clock signal received by a first electronic component and a second clock signal received by a second electronic component, the first clock signal and the second clock signal being generated synchronously and having an identical clock period, the system being configured to:

transmit by means of the first electronic component a first calibration signal synchronously with the first clock signal;

measure a first delay between an active edge of the first calibration signal and an active edge of the second clock signal consecutive to the active edge of the first calibration signal;

transmit by means of the second electronic component a second calibration signal synchronously with the second clock signal;

measure a second delay between an active edge of the second calibration signal and an active edge of the first clock signal consecutive to the active edge of the second calibration signal;

measure a number of clock pulses between the first delay and the second delay, the number of clock pulses corresponding to a multiple of the clock period;

determine a phase difference depending on the parity of the number of clock pulses.

Advantageously:

$$T_\phi = \frac{T_1 - T_2}{2} - \frac{T_C}{2}$$

if n is odd $$T_\phi = \frac{T_1 - T_2}{2}$$

if n is even
where n corresponds to the number of clock pulses, $T_\phi$ corresponds to the phase difference between the first clock signal and the second clock signal, $T_1$ corresponds to the first delay, $T_2$ corresponds to the second delay, and $T_c$ corresponds to the clock period.

Advantageously, the first electronic component and the second electronic component are analogue-to-digital converters or digital-to-analogue converters.

The invention also relates to an array antenna system comprising at least the aforementioned system for determining phase difference.

DESCRIPTION OF THE FIGURES

Other features, details and advantages of the invention will become apparent on reading the description given with reference to the appended drawings, which are given by way of example.

The expression "clock signal" is understood to mean an oscillating electrical signal that sets when the actions of a circuit are performed. Its period is called the clock cycle.

The term "channel" (communication channel or transmission channel) is understood to mean a medium (whether physical or not) allowing a certain amount of information to be transmitted from a source (or sender) to a recipient (or receiver).

Figure 1:
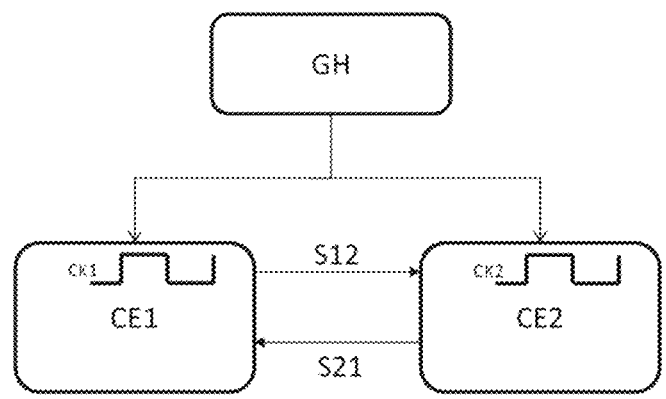
FIG. 1 illustrates a system according to the invention.
Figure 2:
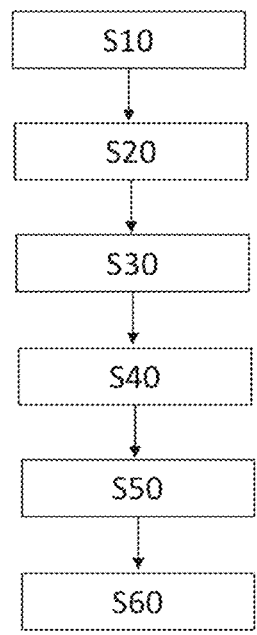
FIG. 2 illustrates the various steps of the method according to the invention.

The configuration in which the invention is implemented is illustrated in FIG. 1. A clock signal having a clock period $T_c$ is generated by a clock generator GH. The clock generator GH may be a piezoelectric quartz-based oscillator, or any other component capable of delivering a clock signal, having a stable clock cycle.

A first electronic component CE1 and a second electronic component CE2 operate synchronously and use the clock signal to do so. According to one embodiment of the invention, the first electronic component CE1 and the second electronic component CE2 are analogue-to-digital converters or digital-to-analogue converters of an antenna array.

In the remainder of the description, the first electronic component CE1 is considered to receive a first clock signal CK1, and the second electronic component CE2 is considered to receive a second clock signal CK2. The first clock signal CK1 and the second clock signal CK2 are generated synchronously: they are either derived from the same clock signal delivered by the clock generator GH, or they are derived from a plurality of clock generators that work synchronously.

Because of technological dispersions between the components, of environmental constraints such as temperature, or of different cable lengths between the clock generator GH and the first electronic component CE1 on the one hand, and between the clock generator GH and the second electronic component CE2 on the other hand, the phase of the clock signal is different when it is received by each of the components: the active edge (rising edge or falling edge) of the clock signal received by each of the components is shifted in time.

In the remainder of the description, despite the phase difference between the two clock signals, the clock cycle (period $T_c$) is considered to be identical and to correspond to the clock cycle imposed by the clock generator GH.

To measure phase difference, the invention is based on the principle of comparison of the position of an edge of the known calibration signal with respect to the edge of the clock, by means of a calibration line between neighbouring components. The components send each other, over this calibration line, an edge synchronous with their clock. It is not necessary to provide a centralized calibration line, with communication with a central control unit, this facilitating implementation on a PCB. Specifically, the invention uses an existing channel, which is used to synchronize the digital interfaces of the converters.

Figure 3:
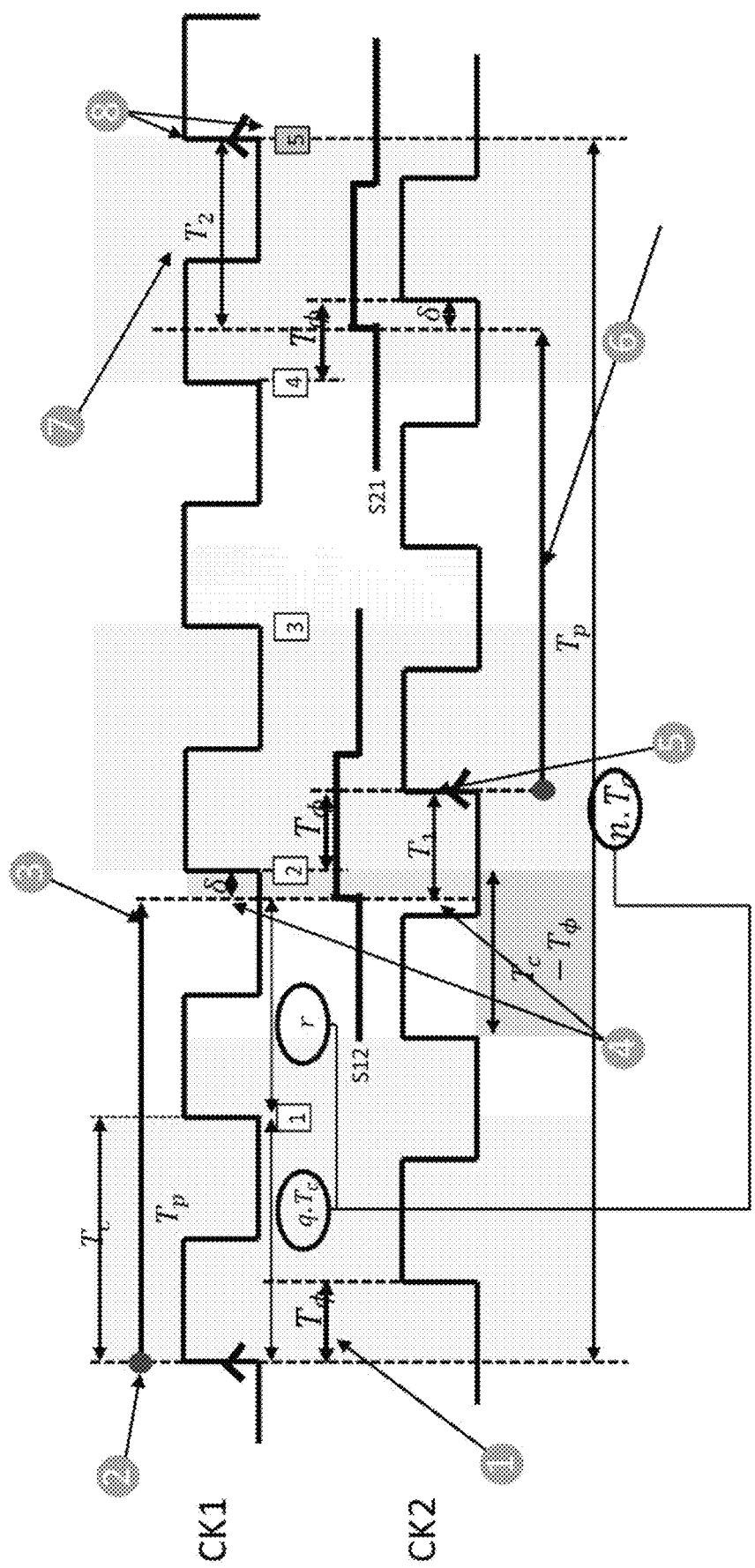
FIG. 3 illustrates the principle of measurement of phase difference according to the invention.

In FIG. 3, the first clock signal CK1 and the second clock signal CK2 are out of phase by an angle $\phi$ (cf. (1)), or are shifted by a time $T_\phi$, these two quantities being related by the following relationship:

$$\phi = 2\pi . T_\phi . Fc, \text{ with } F_c 1 = 1/T_c.$$

In a first step S10 of the method according to the invention, a first calibration signal S12 is transmitted by the first electronic component CE1 synchronously with the first clock signal CK1 (cf. (2) in FIG. 3). The first calibration signal S12 is a binary signal. In FIG. 3, the propagation delay $T_p$ between transmission by the first electronic component CE1 and reception by the second electronic component CE2 corresponds to the delay between the rising edge of the clock signal CK1 used to time transmission of the first calibration signal S12 on the side of the first electronic component CE1 and the rising edge of the calibration signal S12 on the side of the second electronic component CE2 (cf. (3) in FIG. 3), but it could just as well have been decided to consider falling edges rather than rising edges, as the method according to the invention is not modified thereby.

In a second step S20, a first delay $T_1$ is measured between an active edge of the first calibration signal S12 and an active edge of the second clock signal CK2 consecutive to the active edge of the first calibration signal S12. The first delay $T_1$ is separated from the next clock edge of the first electronic component CE1 by a delay 6 (cf. (4) in FIG. 3).

In a third step S30, a second calibration signal S21 is transmitted by the second electronic component CE2 synchronously with the second clock signal CK2 (cf. (5) in FIG. 3). In FIG. 3, the transmission takes place on a rising edge of the second clock signal CK2; this is a convention, and the invention could also be implemented with transmission of the calibration signals on falling edges.

The second calibration signal S21 is a binary signal. In FIG. 3, the propagation delay $T_p$ between transmission by the second electronic component CE2 and reception by the first electronic component CE1 corresponds to the delay between the rising edge on the side of the first electronic component CE1 and the rising edge on the side of the second electronic component CE2 (cf. (6) in FIG. 3).

The lines over which the first calibration signal S12 and the second calibration signal S21 are transmitted have an identical length, and hence the propagation delays of the calibration signals are themselves identical. As a variant, the first calibration signal S12 and the second calibration signal S21 may be transmitted over a bidirectional line. In this case, bidirectional buffers introducing predefined delays are required, to avoid a conflict between the first calibration signal S12 and the second calibration signal S21.

The second calibration signal S21 may be transmitted on the immediately consecutive active edge after having received the first calibration signal S12. However, it is preferable to retransmit the second calibration signal S21 after a known number of clock pulses. This makes the measurement deterministic, and thus allows certain external influences such as technological dispersions, and environmental constraints to be disregarded.

In a fourth step S40, a second delay $T_2$ is measured between an active edge of the second calibration signal S21 and an active edge of the first clock signal CK1 consecutive to the active edge of the second calibration signal S21. The second calibration signal S21 arrives at the first electronic component CE1 with a delay $T_2$ before the next clock edge of the first clock signal CK1, and with a delay $\delta$ before the next clock edge of the second clock signal CK2 (cf. (7) in FIG. 3).

In a fifth step S50, the number n of clock pulses between the transmission of the first calibration signal S12 and the active edge of the first clock signal CK1 consecutive to the active edge of the second calibration signal S21 is determined. A clock pulse corresponds to one clock cycle of period Tc. This number may be determined by a counting unit embedded in the first electronic component CE1. The second electronic component CE2 may also comprise a counting unit, this allowing it to initiate the procedure for determining phase difference.

In a sixth step S60, the phase difference is determined depending on the parity of the number n of clock pulses. In FIG. 3, by way of example, n=5.

Transmission of the calibration signals and determination of the parity of the number of clock pulses add very little complexity to the component, and hence it may easily be integrated into the design of the component. In addition, only two single PCB lines between neighbouring components are required to transmit the calibration signals. In one particularly advantageous embodiment, one and only one PCB line is necessary, in the context of a bidirectional link. The measurement may be carried out in real time, perfectly transparent (without loss of service) to the user of the system.

A specific case in which $\Phi<\pi$ (therefore $T_\phi<1/2$. $T_C$) and $\delta<T_\phi$ has been shown, in detail, in FIG. 3.

FIGS. 4 to 9 illustrate timing diagrams for every possible case.

In every case, based on the delays defined above, it is possible to write the following formulae:

$$n.T_c = 2.T_p + T_1 + T_2 \quad \text{(generic equation No. 1)}$$

In a more general form, a number of clock pulses may be added to the preceding formula to take into account a waiting time between the end of the first delay T1 and the transmission of the second calibration signal S21. Since this number is known, nothing changes as a result thereof in the various calculating steps below. To simplify the calculations, the number of clock pulses spent waiting will therefore be considered to be equal to zero.

It is possible to decompose T p into the sum of an integer number of clock pulses and of a remainder:

$$T_p = q.T_c + r; \; q \in \mathbb{N} \quad \text{(generic equation No. 2)}$$

According to the definition of $\delta$:

$$T_c = r + \delta \quad \text{(generic equation No. 3)}$$

Figure 4:
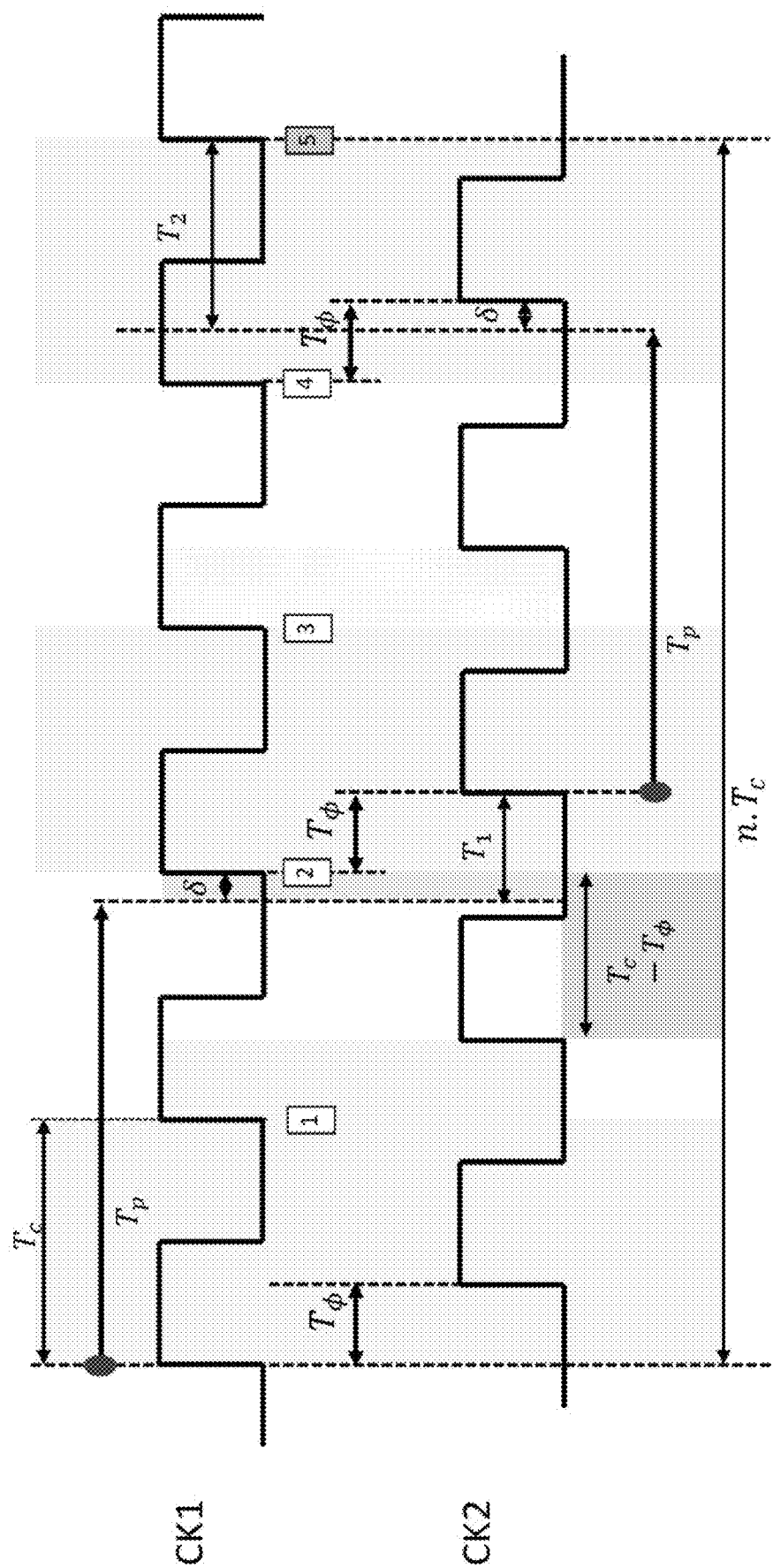
FIGS. 4 to 9 illustrate timing diagrams for the various specific cases of the values $\phi$ and $\delta$.

FIG. 4 illustrates a first specific case, in which $\phi<\pi$ and $\delta<T_\phi$.

In this first case, the first delay $T_1$ and the second delay $T_2$ are respectively equal to:

$$T_1 = \delta + T_\phi \quad \text{(specific equation No. 1 of case 1)}$$

$$T_2 = \delta - T_\phi + T_c \quad \text{(specific equation No. 2 of case 1)}$$

Thus, the following relationship is obtained:

$$T_\phi = \frac{T_1 - T_2}{2} - \frac{T_C}{2}$$

By combining the generic equations and the specific equations of case 1, the following is thus obtained:

$n.T_c = 2.T_p + T_1 + T_2$ $n.T_c = 2.(q.T_c r) + 2.\delta + T_c$ $n.T_c = (2q+3).T_c$ $n = 2q+3$ Thus, for case 1, n is odd.

Figure 5:
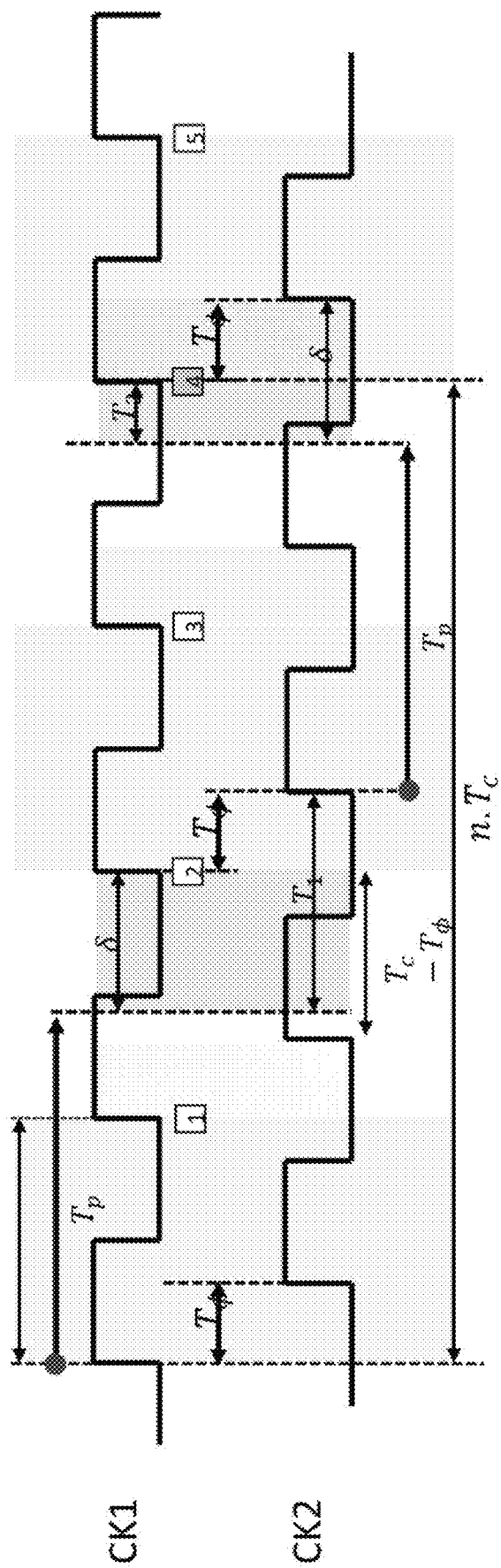

In the same way, for case 2 illustrated in FIG. 5, for which $\phi<\pi$ and $T_\phi<\delta<T_c-T_\phi$, the first delay $T_1$ and the second delay $T_2$ are respectively equal to:

$T_1 = \delta + T_\phi$     (specific equation No. 1 of case 2)

$T_2 = \delta + T_\phi$     (specific equation No. 2 of case 2)

Thus, the following relationship is obtained:

$$T_\phi = \frac{T_1 - T_2}{2}$$

By applying the same calculations as above, the following is obtained:

$n = 2(q+1)$

Thus, for case 2, n is even.

Figure 6:
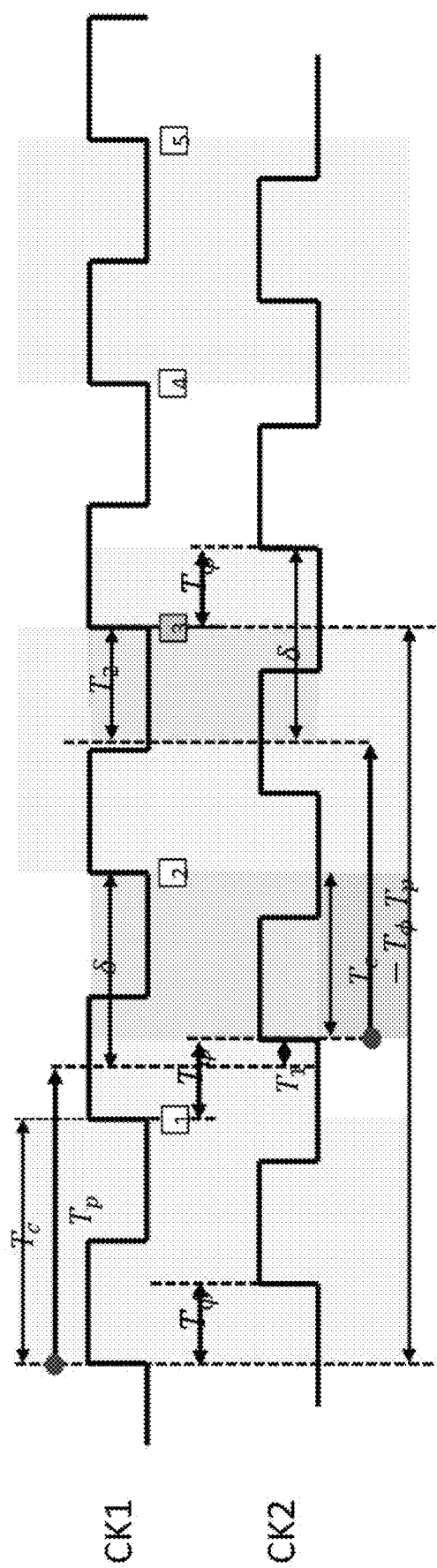

For case 3 illustrated in FIG. 6, for which $\phi<\pi$ and $\delta>T_c-T_\phi$, the first delay $T_1$ and the second delay $T_2$ are respectively equal to:

$T_1 = \delta + T_\phi - T_c$     (specific equation No. 1 of case 3)

$T_2 = \delta - T_\phi$     (specific equation No. 2 of case 3)

Thus, the following relationship is obtained:

$$T_\phi = \frac{T_1 - T_2}{2} - \frac{T_C}{2}$$

By applying the same calculations as above, the following is obtained:

$n = 2q+1$

Thus, for case 3, n is odd.

Figure 7:
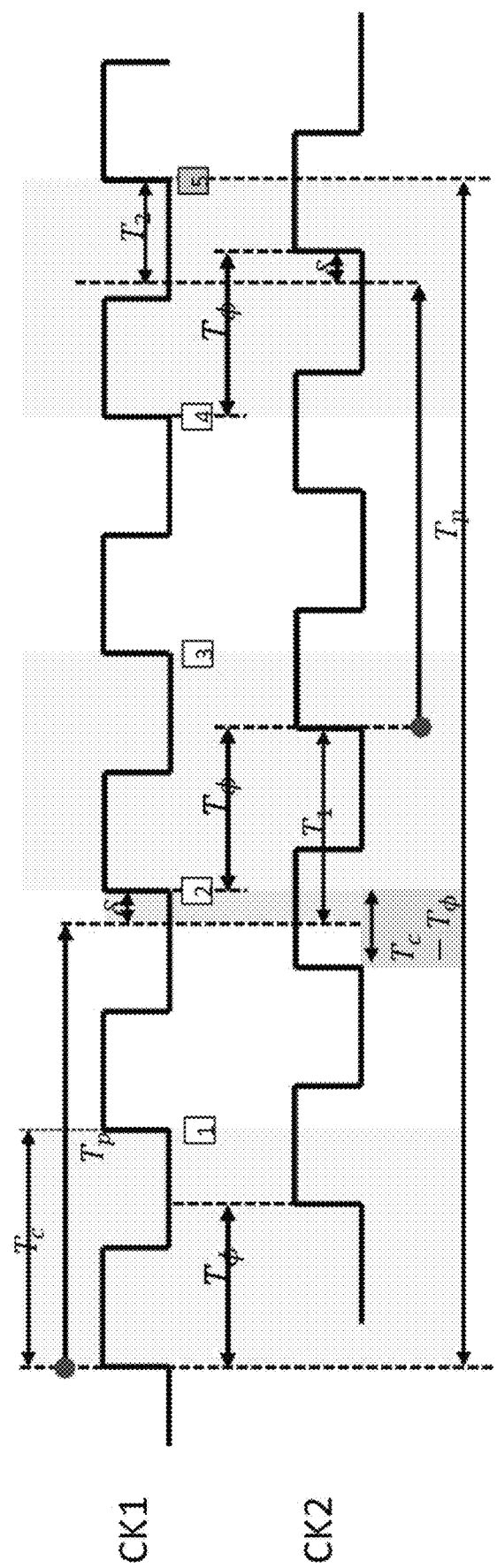

For case 4 illustrated in FIG. 7, for which $\phi>\pi$ and $\delta<T_c-T_\phi$, the first delay $T_1$ and the second delay $T_2$ are respectively equal to:

$T_1 = \delta + T_\phi$     (specific equation No. 1 of case 4)

$T_2 = \delta - T_\phi + T_c$     (specific equation No. 2 of case 4)

Thus, the following relationship is obtained:

$$T_\phi = \frac{T_1 - T_2}{2} - \frac{T_C}{2}$$

By applying the same calculations as above, the following is obtained:

$n = 2q+3$

Thus, for case 4, n is odd.

Figure 8:
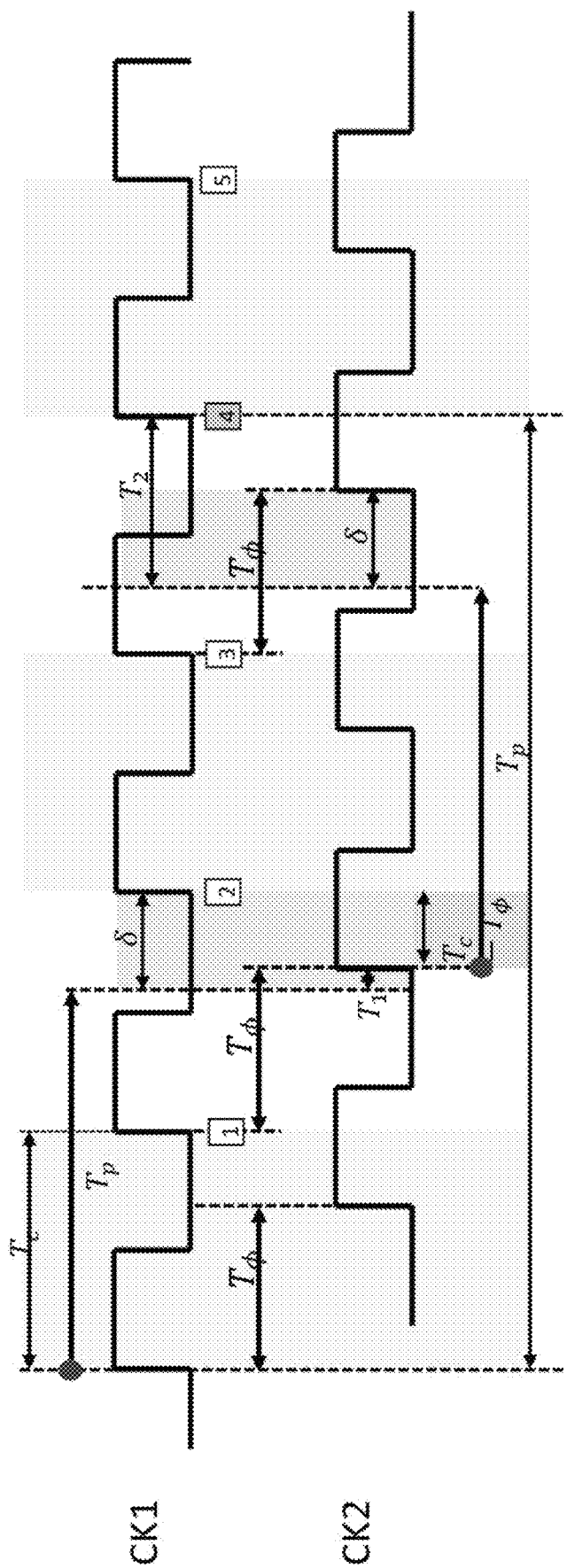

For case 5 illustrated in FIG. 8, for which $\phi>\pi$ and $T_c-T_\phi<\delta<T_\phi$, the first delay $T_1$ and the second delay $T_2$ are respectively equal to:

$T_1 = \delta + T_\phi T_c$     (specific equation No. 1 of case 5)

$T_2 = \delta - T_\phi + T_c$     (specific equation No. 2 of case 5)

Thus, the following relationship is obtained:

$$T_\phi = \frac{T_1 - T_2}{2}$$

By applying the same calculations as above, the following is obtained:

$n = 2(q+1)$

Thus, for case 5, n is even.

Figure 9:
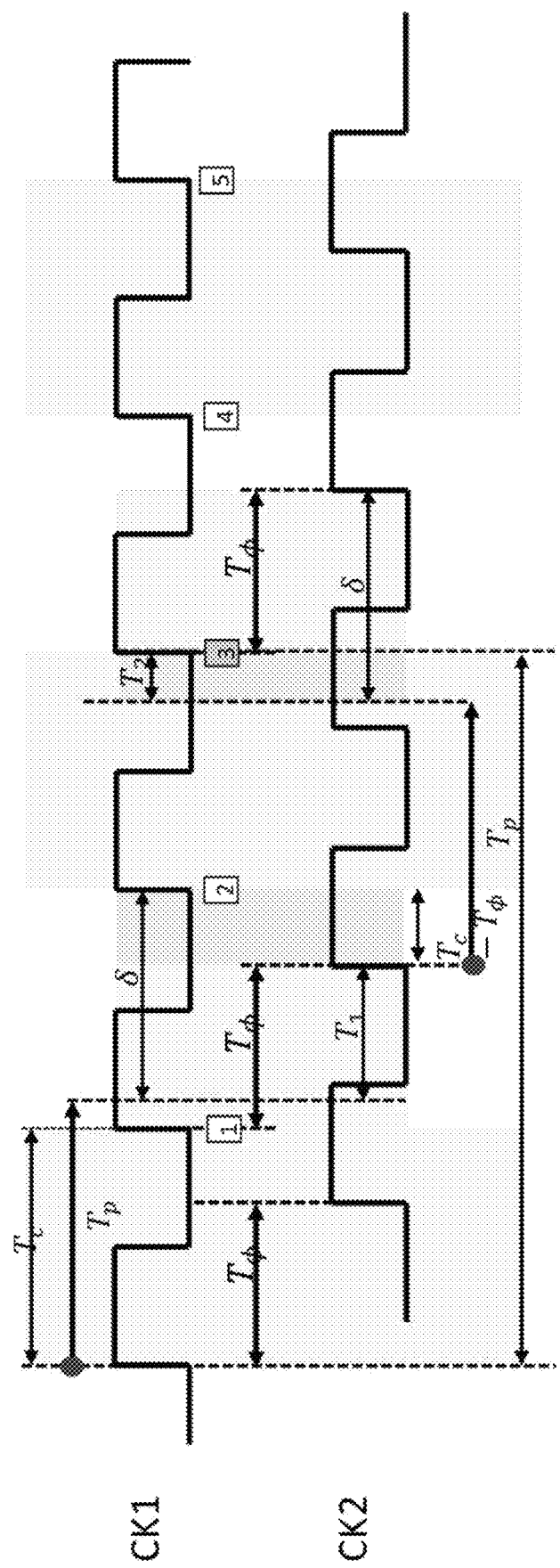

For case 6 illustrated in FIG. 9, for which $\phi>\pi$ and $\delta>T_\phi$, the first delay $T_1$ and the second delay $T_2$ are respectively equal to:

$T_1 = \delta + T_\phi T_c$     (specific equation No. 1 of case 6)

$T_2 = \delta - T_\phi$     (specific equation No. 2 of case 6)

Thus, the following relationship is obtained:

$$T_\phi = \frac{T_1 - T_2}{2} - \frac{T_C}{2}$$

By applying the same calculations as above, the following is obtained:

$n = 2q+1$

Thus, for case 6, n is odd.

Irrespectively of the specific case in question, it may therefore be concluded that:

$$T_\phi = \frac{T_1 - T_2}{2} - \frac{T_C}{2}$$

if n is odd $$T_\phi = \frac{T_1 - T_2}{2}$$

if n is even

The angular value $\Phi$ of the phase difference between the clock signals is related to $T_\phi$ by the formula $\Phi = 2\pi.T_\phi.Fc$, with $F_c = 1/T_c$.

Counting the number of clock pulses n between transmission of the first calibration signal S12 and the active edge of the first clock signal CK1 consecutive to the active edge of the second calibration signal S21 thus allows the formula to be used to calculate the phase difference between the two clock signals to be determined.

According to one embodiment, the first delay $T_1$ and the second delay $T_2$ may be determined by determining the delay usually used to detect metastability of the synchronization signals (synchronization signal too close to a clock edge) as in particular described in patent application FR 3 043 477 A1.

The method for determining phase difference may be implemented periodically. This may be advantageous, in particular in environments with large temperature variations, as these may cause significant phase differences between the clocks. In the context of use of analogue-to-digital converters or of digital-to-analogue converters in arrayed antennas in a satellite, it is essential for phase alignment to be kept under control.

The method according to the invention may also comprise a step of correcting the phase of one of the two clock signals, depending on the phase difference determined according to the method described above. The correction may be made automatically, using TDA solutions embedded in the electronic component (TDA standing for Time Delay Adjustment).

The invention has been described in the context of determination of the phase difference between the clock signals received by two electronic components. If required, the phase difference between more than two clock signals received by more than two electronic components may be determined, by coupling the electronic components pairwise, and by transmitting the phase-difference values to a control unit.

It may also be advantageous to pair two electronic components that are very far apart from each other (which may be the case for a very large antenna array), to determine the phase difference between the clock signals, and to apply the corresponding correction to one of the two electronic components, and to other electronic components located in proximity to the electronic component.

The method and the system according to the invention thus allow phase-difference errors to be measured without any help from an external component, this facilitating its implementation.

The invention claimed is:

1. A method for determining the phase difference between a first clock signal (CK1) received by a first electronic component (CE1) and a second clock signal (CK2) received by a second electronic component (CE2), the first clock signal (CK1) and the second clock signal (CK2) being generated synchronously and having an identical clock period ($T_c$), comprising the steps of:
   S10) transmitting by means of the first electronic component (CE1) a first calibration signal (S12) synchronously with the first clock signal (CK1);
   S20) measuring a first delay ($T_1$) between an active edge of the first calibration signal (S12) and an active edge of the second clock signal (CK2) consecutive to the active edge of the first calibration signal (S12);
   S30) transmitting by means of the second electronic component (CE2) a second calibration signal (S21) synchronously with the second clock signal (CK2);
   S40) measuring a second delay ($T_2$) between an active edge of the second calibration signal (S21) and an active edge of the first clock signal (CK1) consecutive to the active edge of the second calibration signal (S21);
   S50) measuring the number (n) of clock pulses between the transmission of the first calibration signal (S12) and the active edge of the first clock signal (CK1) consecutive to the active edge of the second calibration signal (S21), the number (n) of clock pulses corresponding to a multiple of the clock period ($T_c$);
   S60) determining the phase difference depending on the parity of the number (n) of clock pulses.

2. The method according to claim 1, wherein:

$$T_\phi = \frac{T_1 - T_2}{2} - \frac{T_C}{2}$$

it n is odd $$T_\phi = \frac{T_1 - T_2}{2}$$

n is even
   where n corresponds to the number of clock pulses, $T_\phi$ corresponds to the phase difference between the first clock signal (CK1) and the second clock signal (CK2), $T_1$ corresponds to the first delay, $T_2$ corresponds to the second delay, and $T_c$ corresponds to the clock period.

3. The method according to claim 1, wherein the second calibration signal (S21) is transmitted after a predetermined number of clock pulses consecutive to the first delay ($T_1$).

4. The method according to claim 1, further comprising a step of correcting the phase difference between the first electronic component (CE1) and the second electronic component (CE2), depending on the phase difference determined in step S60).

5. The method according to claim 1, wherein the phase difference is determined periodically.

6. The method according to claim 1, wherein the first calibration signal (S12) is routed over a first line (L1), the second calibration signal (S21) is routed over a second line (L2), the length of the first line (L1) and the length of the second line (L2) being equal.

7. The method according to claim 1, wherein the first calibration signal (S12) and the second calibration signal (S21) are routed over the same bidirectional line, the second calibration signal (S21) being delayed with respect to receipt of the first calibration signal (S12) so as to avoid a conflict between the first calibration signal (S12) and the second calibration signal (S21).

8. A system for determining the phase difference between a first clock signal (CK1) received by a first electronic component (CE1) and a second clock signal (CK2) received by a second electronic component (CE2), the first clock signal (CK1) and the second clock signal (CK2) being generated synchronously and having an identical clock period ($T_c$), the system being configured to:
   transmit by means of the first electronic component (CE1) a first calibration signal (S12) synchronously with the first clock signal (CK1);
   measure a first delay ($T_1$) between an active edge of the first calibration signal (S12) and an active edge of the second clock signal (CK2) consecutive to the active edge of the first calibration signal (S12);
   transmit by means of the second electronic component (CE2) a second calibration signal (S21) synchronously with the second clock signal (CK2);
   measure a second delay ($T_2$) between an active edge of the second calibration signal (S21) and an active edge of the first clock signal (CK1) consecutive to the active edge of the second calibration signal (S21);
   measure a number (n) of clock pulses between the first delay ($T_1$) and the second delay ($T_2$), the number (n) of clock pulses corresponding to a multiple of the clock period ($T_c$);

determine a phase difference depending on the parity of the number (n) of clock pulses.

9. The system according to claim 8, wherein:

$$T_\phi = \frac{T_1 - T_2}{2} - \frac{T_C}{2}$$

if n is odd $$T_\phi = \frac{T_1 - T_2}{2}$$

if n is even
where n corresponds to the number of clock pulses, $T_\phi$ corresponds to the phase difference between the first clock signal (CK1) and the second clock signal (CK2), $T_1$ corresponds to the first delay, $T_2$ corresponds to the second delay, and $T_c$ corresponds to the clock period.

10. The system according to claim 8, wherein the first electronic component (CE1) and the second electronic component (CE2) are analogue-to-digital converters or digital-to-analogue converters.

11. An array antenna system, characterized in that it comprises at least one system for determining phase difference according to claim 8.

12. The method according to claim 3, further comprising a step of correcting the phase difference between the first electronic component (CE1) and the second electronic component (CE2), depending on the phase difference determined in step S60).

13. The method according to claim 2, further comprising a step of correcting the phase difference between the first electronic component (CE1) and the second electronic component (CE2), depending on the phase difference determined in step S60).

14. The method according to claim 2, wherein the second calibration signal (S21) is transmitted after a predetermined number of clock pulses consecutive to the first delay ($T_1$).

15. The method according to claim 4, wherein the phase difference is determined periodically.

16. The method according to claim 3, wherein the phase difference is determined periodically.

17. The method according to claim 2, wherein the phase difference is determined periodically.

18. The method according to claim 4, wherein the first calibration signal (S12) is routed over a first line (L1), the second calibration signal (S21) is routed over a second line (L2), the length of the first line (L1) and the length of the second line (L2) being equal.

19. The method according to claim 3, wherein the first calibration signal (S12) is routed over a first line (L1), the second calibration signal (S21) is routed over a second line (L2), the length of the first line (L1) and the length of the second line (L2) being equal.

20. The method according to claim 2, wherein the first calibration signal (S12) is routed over a first line (L1), the second calibration signal (S21) is routed over a second line (L2), the length of the first line (L1) and the length of the second line (L2) being equal.

* * * * *